United States Patent
Seely et al.

(10) Patent No.: US 6,188,391 B1
(45) Date of Patent: Feb. 13, 2001

(54) TWO-LAYER CAPACITIVE TOUCHPAD AND METHOD OF MAKING SAME

(75) Inventors: Joel Seely, Milpitas; Robert Leonard Malak, San Jose; Timothy Peter Allen, Santa Cruz; Richard Robert Schediwy, Union City; William Andrew Cesarotti, San Francisco, all of CA (US)

(73) Assignee: Synaptics, Inc., San Jose, CA (US)

( * ) Notice: Under 35 U.S.C. 154(b), the term of this patent shall be extended for 0 days.

(21) Appl. No.: 09/112,097

(22) Filed: Jul. 9, 1998

(51) Int. Cl.[7] ..................................................... G09G 5/00
(52) U.S. Cl. ........................................ 345/173; 178/18.03
(58) Field of Search ........................... 345/173, 174–179; 178/18.06, 18.01, 18.03; 341/22, 34, 33

(56) References Cited

U.S. PATENT DOCUMENTS

| 5,305,017 | 4/1994 | Gerpheide . |
| 5,349,303 | 9/1994 | Gerpheide . |
| 5,543,590 | 8/1996 | Gillespie et al. . |
| 5,565,658 | 10/1996 | Gerpheide et al. . |
| 5,757,368 | 5/1998 | Gerpheide et al. . |
| 5,767,457 | 6/1998 | Gerpheide et al. . |
| 5,869,790 | * 2/1999 | Shigetaka et al. ................... 345/174 |
| 5,926,171 | * 7/1999 | Matsufusa et al. .................. 345/174 |

OTHER PUBLICATIONS

Website, http://www.safecomputing.com/alpspad.htm, "Cursor Controls—ALPS Numeric Pad & TrackPad", Aug. 6, 1998, p. 1.
Website, http://www.safecomputing.com/cirque_cats.htm, "Alternative Keyboards/Adapters—Cirque GlidePoint—Easycat, Powercat, Smartcat", Aug. 6, 1998, pp. 1–2.

* cited by examiner

Primary Examiner—Regina Liang
(74) Attorney, Agent, or Firm—Malcolm B. Wittenberg

(57) ABSTRACT

By suitable use of screen-printed carbon ink patterning, combined with patterning of the solder-mask layer on the top (finger) surface, a compact capacitive touchpad pointing device has been realized using only a two-layer board as a substrate. The first layer, on the topside of the printed circuit board, combines both the horizontal and vertical sensor electrode traces. The second layer, located on the underside of the printed circuit board, is formed in the conventional manner by attaching the controller chip and/or related circuitry.

22 Claims, 7 Drawing Sheets

FIG. 7
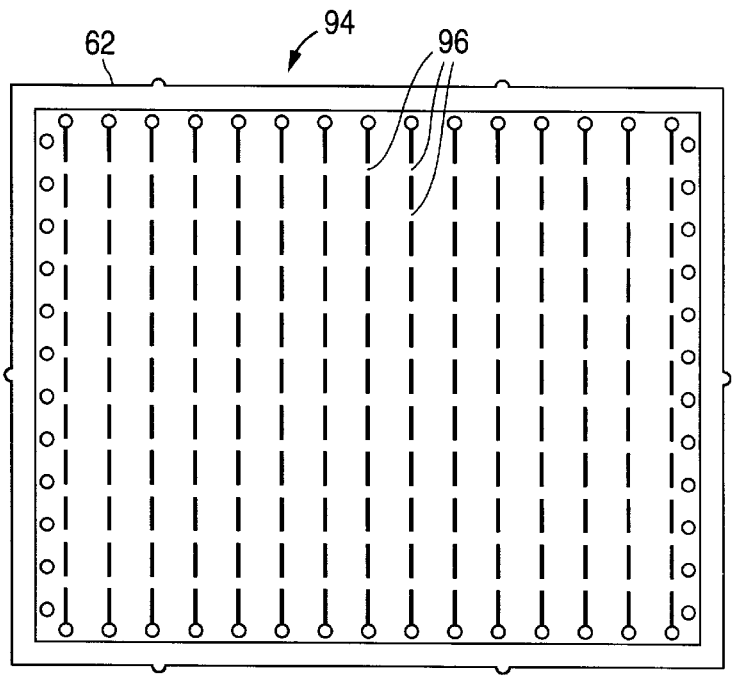
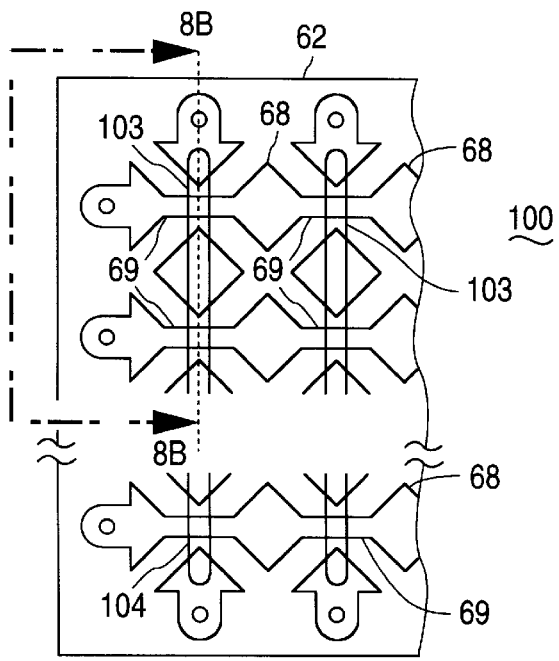
FIG. 8A
FIG. 8B
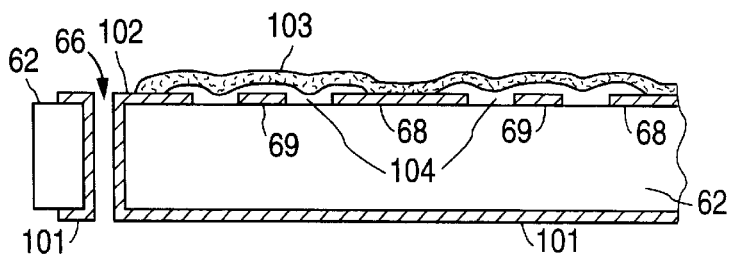

TWO-LAYER CAPACITIVE TOUCHPAD AND METHOD OF MAKING SAME

BACKGROUND OF THE INVENTION

1. Technical Field

The present invention relates to touchpad pointing devices, and in particular to a touchpad pointing device which is less expensive to fabricate.

2. Summary of the Prior Art

Over the last several years, capacitive touchpad pointing devices have been used extensively in personal computers. When used in conjunction with a computer, a touchpad allows the user to manipulate a graphics cursor on a CRT display. The touchpad comprises a sensitive planar surface and means for detecting the position of an object, such as a finger or a stylus, near or in contact with, the sensitive planar surface. The touchpad continuously communicates this position information to the electronic apparatus, typically at a rate of from 40 to 100 Hz.

Presently, approximately 70% of all new notebook computers include a touchpad as the primary pointing device. In this competitive touchpad market, price has become an increasingly important factor. A touchpad design that is intrinsically less expensive to make has significant commercial advantage.

For reasons to be disclosed below, most existing capacitive touchpad designs are built using a four-layer printed circuit board as the basic structural substrate. The circuit traces on the "top" two (finger-side) layers of the board serve as the capacitive sensing matrix, and the traces on the "bottom", or underside (component-side) layer provide electrical interconnections for the components mounted thereon. The remaining buried layer, the fourth layer, is generally used as a ground plane though it could, in theory, be put to some other use.

While four-layer printed circuit boards are widely available from many manufacturers, it is well-known that they are substantially more expensive than two-layer printed circuit boards of the same size. In large quantities, in excess of 200,000 units per month, a four-layer touchpad-sized printed circuit board with dimensions of, for example, 65 mm by 49 mm might typically cost $0.80 per unit, with the exact figure depending on many factors. A two-layer circuit board of the same size might cost as little as approximately $0.40. This savings is substantial when compared to the overall cost of the entire touchpad device. The ability to use a two-layer instead of four-layer circuit board would tend to give a strong competitive advantage to a manufacturer capable of producing such a device.

Two-layer touchpads have been constructed for limited applications. As will be described in greater detail below, these two-layer touchpads require that the controller chip be remotely located on the same circuit board away from the touch sensitive area. Thus, such two-layer touchpads do not perform an equivalent function as do present four-layer touchpads.

SUMMARY OF THE INVENTION

The subject patent application relates to a capacitive touchpad using a two-layer printed circuit board and method of fabricating it. In particular, an improved touchpad for use in a system for moving a cursor on a display screen is described which includes a printed circuit board having a top and under side, a first layer formed on the top side of the printed circuit board which includes both a plurality of horizontal sensor electrodes and a plurality of vertical sensor electrodes, and a second layer formed on the underside of the printed circuit board which includes the standard electrical components associated with the touchpad, such as the controller chip and associated interconnect wiring.

In the preferred embodiment the horizontal, or X electrodes are metal traces made by conventional printed circuit fabrication, and are, typically copper. The vertical electrodes are made of conductive ink, such as carbon ink. An insulator is provided at each intersection of a metal trace and a conductive ink trace. This insulator may be a solder mask insulator. An additional protective layer of mylar is provided on top of the first layer.

By suitable use of screen-printed carbon ink patterning, combined with patterning of the solder-mask layer on the top (finger) surface, a compact capacitive touchpad pointing device has been realized using only a 2-layer board as a substrate. The first layer is a single composite layer for both the horizontal and vertical sensor electrode traces; and the second layer, on the underside of the printed circuit board, includes the controller chip, sensor circuitry and/or related circuitry. The present invention is advantageous because it significantly reduces the cost of touchpad devices without adversely affecting their functionality.

A BRIEF DESCRIPTION OF THE DRAWINGS

Figure 8A:
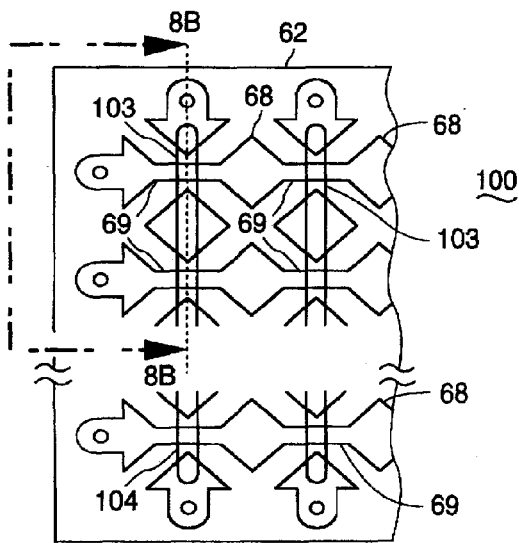
FIG. 8A is a plan view.
Figure 8B:
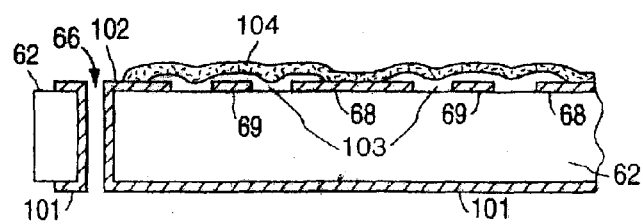

FIG. 8B a cross-sectional view showing details of a composite, two-layer sensor touchpad in accordance with the present invention.

Figure 9:
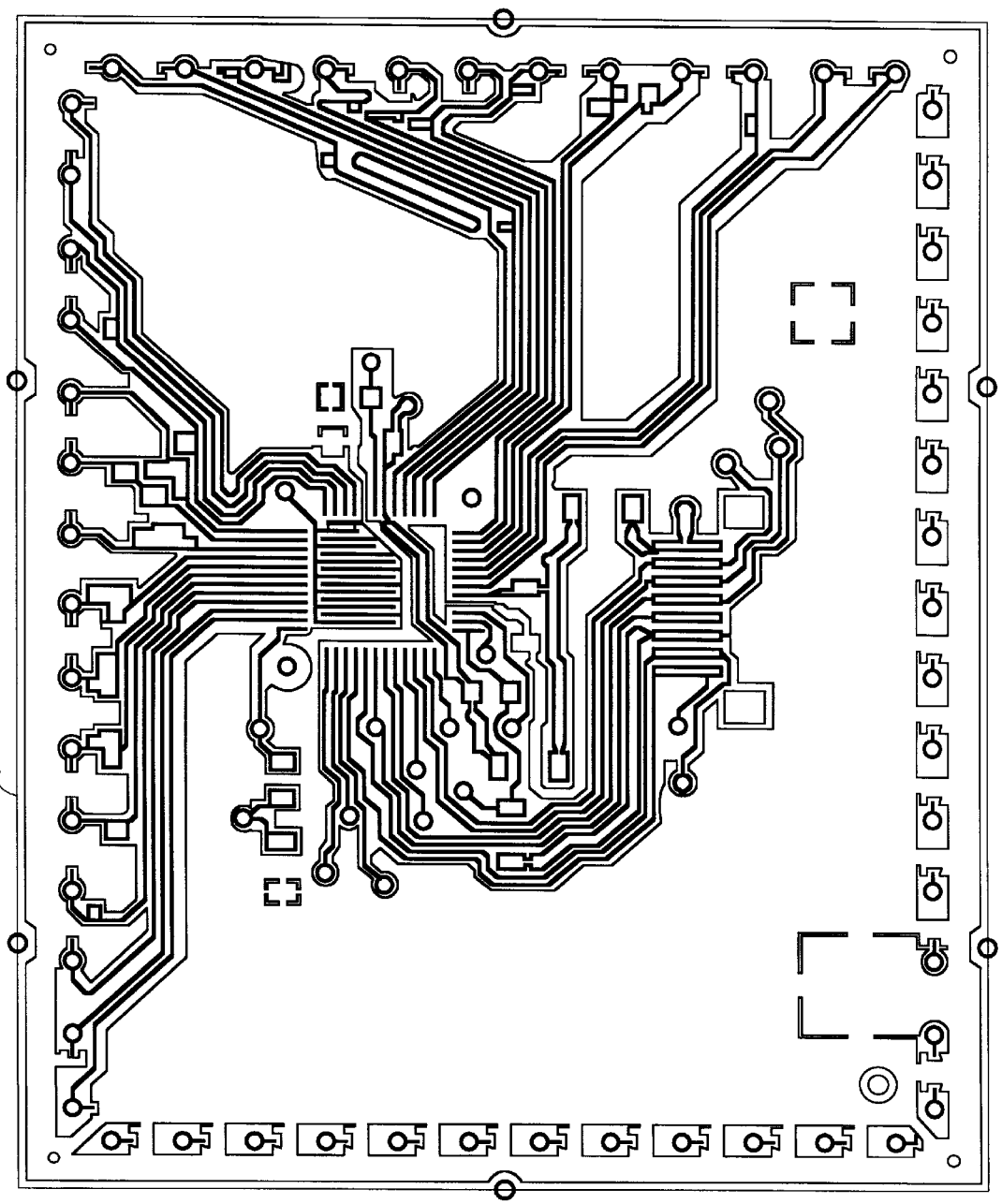
Figure 4:
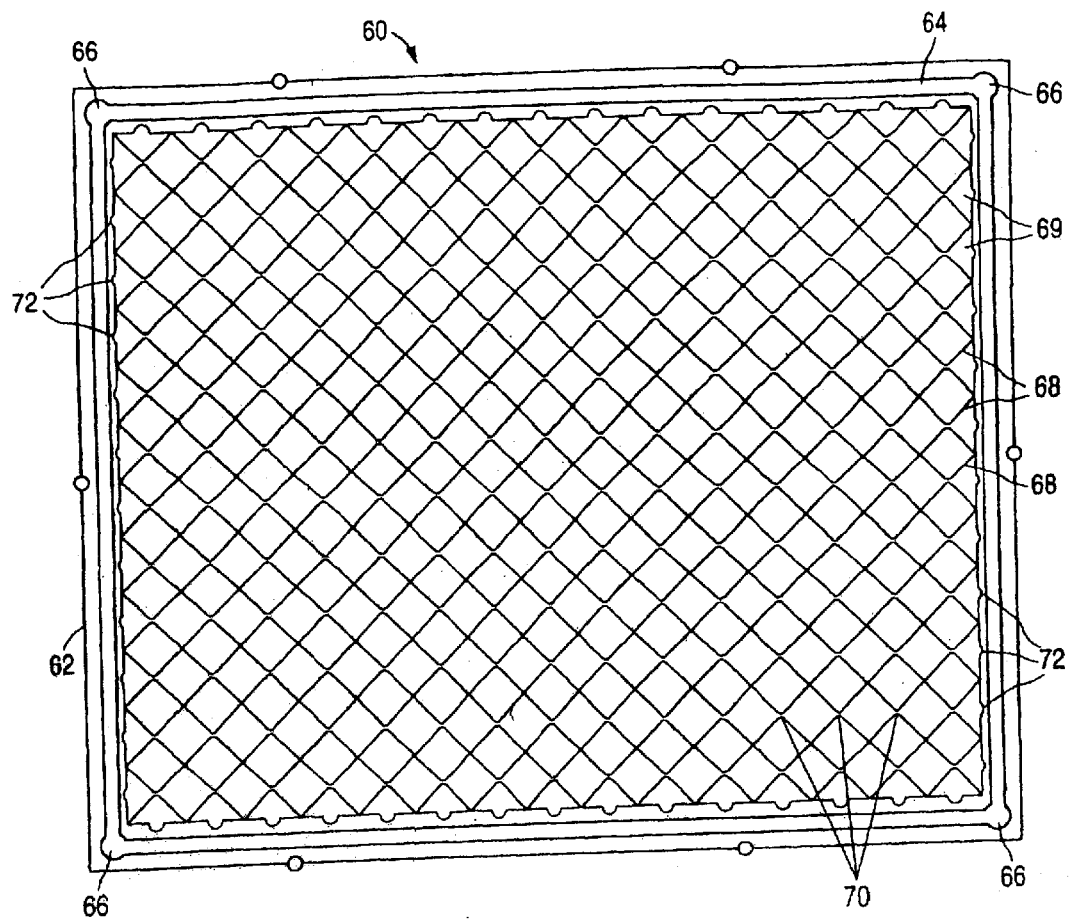

FIG. 9 is a view of the actual underside of a two-layer touchpad showing components attached thereto.

DESCRIPTION OF THE PREFERRED EMBODIMENTS

All four-layer technologies share an important common feature: the finger is detected by a plurality of horizontally-aligned sensor electrodes disposed on a first layer which is separated by an insulator from a plurality of vertically-aligned sensor electrodes disposed on a second layer. Such sensor electrodes are usually formed as standard copper PC board traces. Thus, the sensitive area of the touchpad consists of a 2-layer structure: one layer with horizontally-running electrode traces, and another layer with vertically-running electrode traces.

An example sensor electrode arrangement for a four-layer touchpad is shown in FIGS. 1A–1D. More details of this structure is described in U.S. Pat. No. 5,543,590 entitled "Object Position Detector with Edge Motion Feature", assigned to the same assignee as the present invention, and incorporated herein by reference. Top, bottom, composite and cross-sectional views, respectively, are shown, of a capacitive touchpad 10 which includes a sensor array 22. The surface of touchpad 10 is designed to maximize the capacitive coupling to a finger or other conductive object.

The touch sensor array 22 includes a first set of conductive wires or traces 26 disposed on a bottom layer 28 thereof and run in a first direction to comprise horizontal positions of the touch sensor array 22. A second set of conductive wires or traces 30 are disposed on a top layer 32 thereof and run in a second direction preferably orthogonally to the first direction to form the vertical positions of the touch sensor array 22.

Figure 1A:
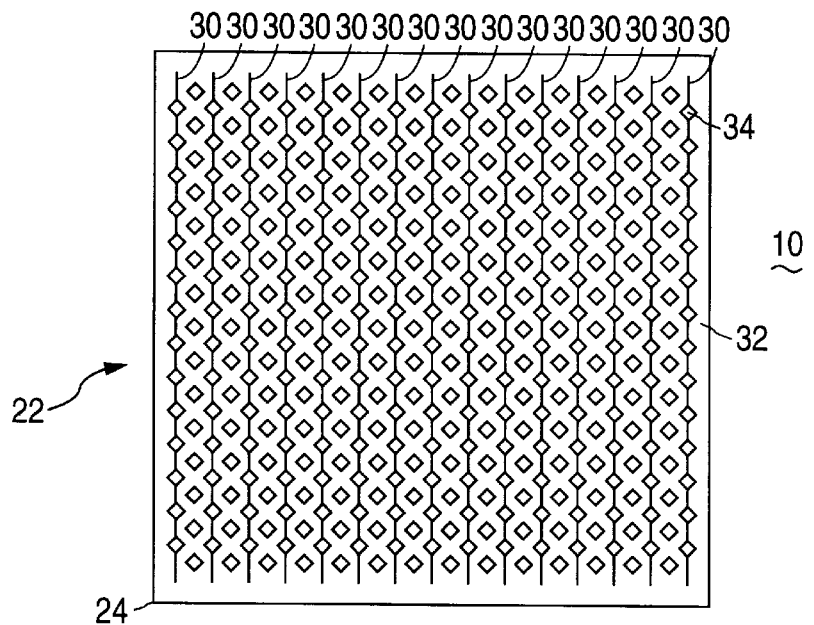
FIGS. 1A–1D illustrate a conventional four-layer touchpad.
Figure 1B:
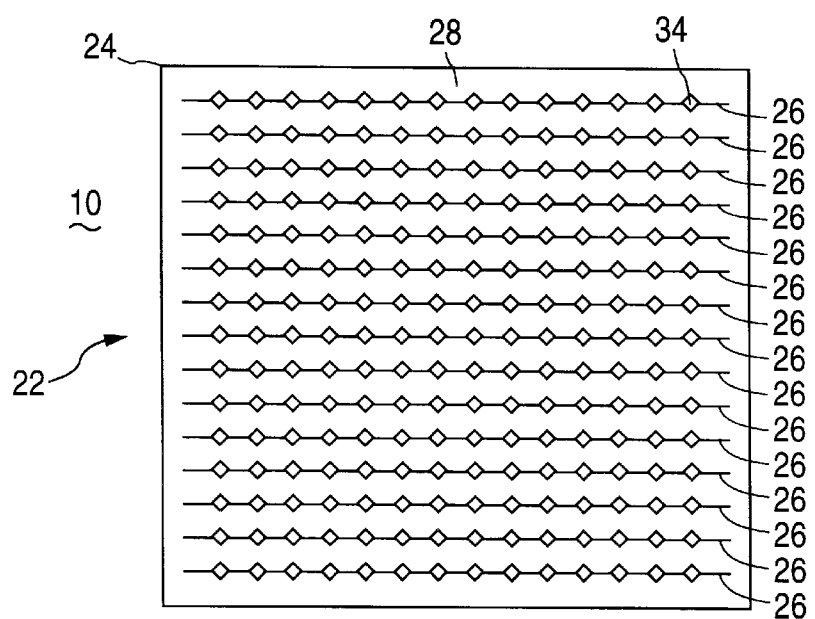
Figure 1C:
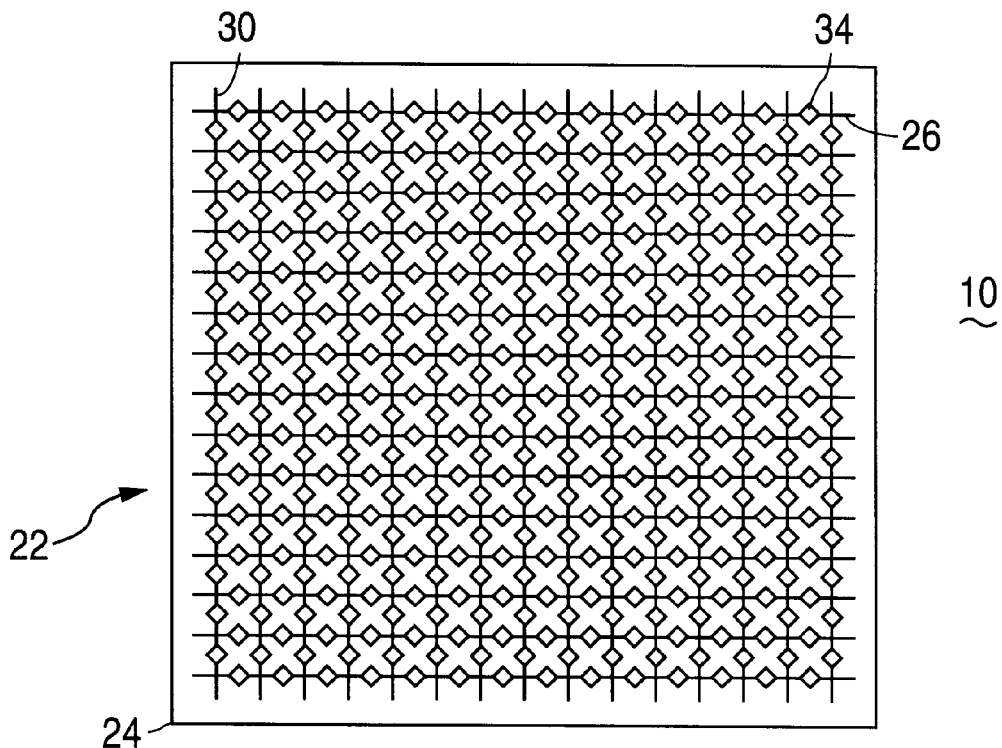
Figure 1D:
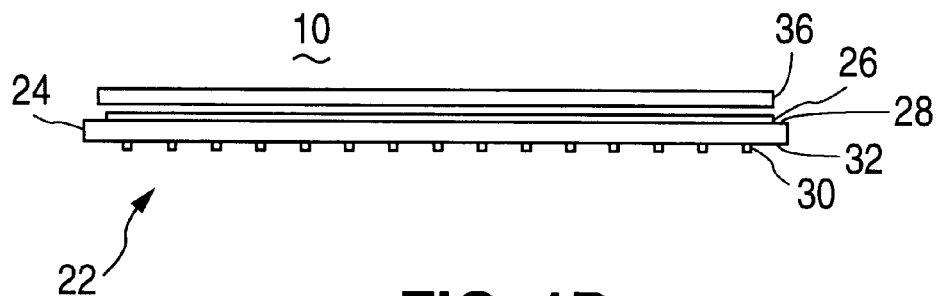

The first and second sets of conductive traces 26 and 30 are alternately in contact with periodic sense pads 34 comprising enlarged areas, shown as diamonds in FIGS. 1A–1C. While sense pads 34 are shown as diamonds in FIGS. 1A–1C, any shape, such as circles, which allows them to be closely packed may be used. As an arbitrary convention, the first set of conductive traces 26 will be referred to as being oriented in the "X" or "horizontal" direction and can also be referred to as "X lines" or "horizontal sensor electrodes". The second set of conductive traces 30 will be referred to as being oriented in the "Y" or "vertical" direction and can also be referred to as "Y lines" or "vertical sensor electrodes". It should be understood that the use of the terms "horizontal" and "vertical" are not to be limited to a specific orientation of a touchpad with respect to the computer or device with which it is used. In other words, a user may in fact, rotate the touchpad such that what are defined as "vertical" traces end up horizontally with respect to the user.

Every other sense pad 34 in each direction in the pad pattern is connected to first and second sets of conductive traces 26 and 30 on the top and bottom surfaces 28 and 32, respectively of substrate 24. Substrate 24 may be a printed circuit board made using standard industry techniques. An insulating layer 36, typically of mylar, is disposed over the sense pads 34 on the top of the horizontal electrodes. A further description of the operation of touchpad 10, as well as a capacitive position sensing system in which a touchpad is incorporated, is provided in the above-referenced U.S. Pat. No. 5,543,590.

The X and Y sensor electrodes are connected to measurement and control electronics, as is well known. In commercial applications, these electronics reside on a nearby mixed-signal ASIC, the controller chip. Each of the horizontal and vertical sensor electrodes is connected to a separate pin on the controller chip. Thus only two conductive layers are actually required for the detection and location of the user's finger: one layer for the horizontal electrodes, and one layer for the vertical electrodes.

Figure 2:
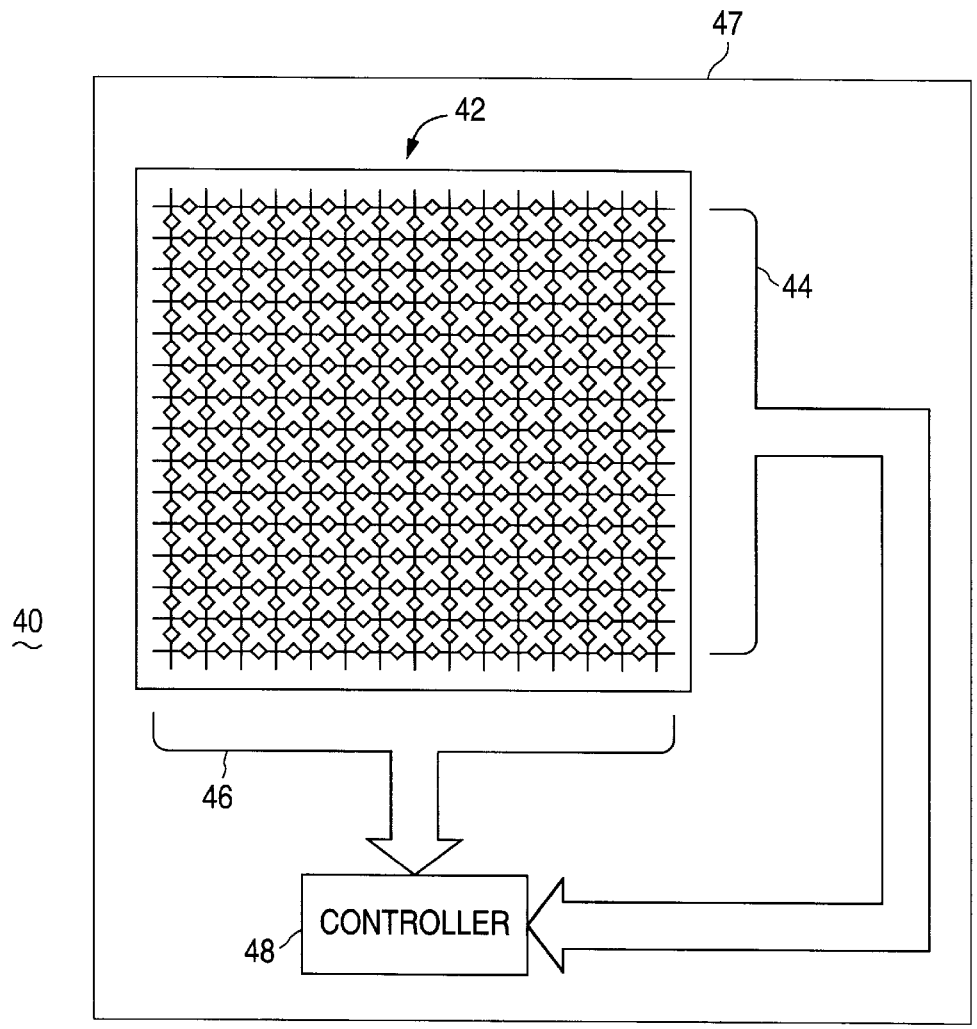
FIG. 2 is a block, schematic diagram of a prior art two-layer touchpad device.

As noted above, two-layer touchpads have already been constructed for a restricted set of applications where the controller chip is located on the same circuit board remotely from the sensitive area. FIG. 2 is a block, schematic diagram of such a two-layer touchpad device 40. A two-layer touch-sensitive array 42 includes a plurality of horizontal sensor electrodes 44 and a plurality of vertical sensor electrodes 46 on printed circuit board 47. The vertical and horizontal sensors are connected to the controller chip 48, as is well known in the art. Notice that the controller chip 48 and the sensor electrodes 44 and 46 are disposed on two non-overlapping regions of the same circuit board 47. Circuit board 47 must be substantially larger than the "sensitive area", e.g., the touch-sensitive array 42, in order to provide room for mounting the controller chip 48, associated circuitry, and the interconnections between the controller chip 48 and the sensor electrodes 44 and 46.

Two-layer touchpads constructed in the manner shown in FIG. 2 are suitable for applications where the physical size of the device is not tightly constrained, i.e., applications where a large touchpad circuit board with inactive (non-touch-sensitive) regions does not pose a packaging or mounting problem. Since the principal commercial application of touchpads is in notebook computers, where physical space is at an extreme premium, this geometrical configuration is not favored because it is not compact.

Figure 3:
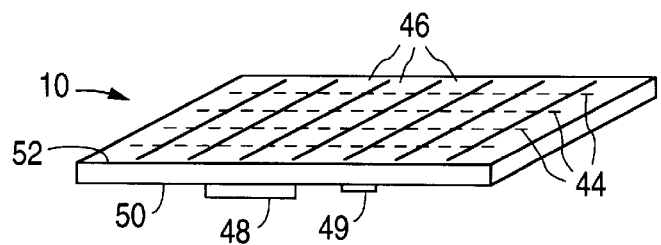
FIG. 3 is a perspective view of a prior art four-layer touchpad device.

If the touchpad is created on a four-layer circuit board, the controller chip 46 and associated circuitry 49 can be disposed on the underside 50 of the board as shown in FIG. 3. The horizontal and vertical sensor electrodes 44 and 46 are disposed on the top two layers 52 of the circuit board 10. Strictly speaking, a three-layer circuit board would be sufficient to achieve this same over-under geometry. As a practical matter, three-layer printed-circuit boards, however, are not significantly less expensive than four-layer circuit boards and are not commercially available. The remaining buried layer is usually employed as a ground plane. The presence of a ground plane may be beneficial to the touchpad's operation for a variety of secondary reasons such as improved immunity to electrostatic discharge. However, it has been found that a ground plane is not essential, and in accordance with the present invention, it is one of the layers that has been eliminated. In summary, the conventional four-layer circuit board has four layers: the first and second layers, respectively, are for the horizontal and vertical sensor electrodes; the third is the ground plane; and the fourth is the components and associated circuitry mounted on the underside of the printed circuit board.

The four-layer touchpad shown in FIGS. 1 and 3 has one principal advantage over the two-layer pad shown in FIG. 2 and that is one of compactness. The touchpad printed circuit board 10 of the four-layer design of FIGS. 1 and 3 is no larger than the required sensitive area, so no space is wasted. This is a critical design feature for use in a notebook computer application. The industry has accepted a standard PC board size which is only slightly larger than the sensitive area 42. For use in such standard applications, the 2-layer configuration shown in FIG. 2 is not suitable at all.

The present invention allows the components to be mounted on the back side of a 2-layer printed circuit board, with both the horizontal and vertical electrodes disposed on the top layer without interference. This permits a two-layer touchpad to fit in the standard compact size particularly suited for laptop computers and similar application.

Figure 4:
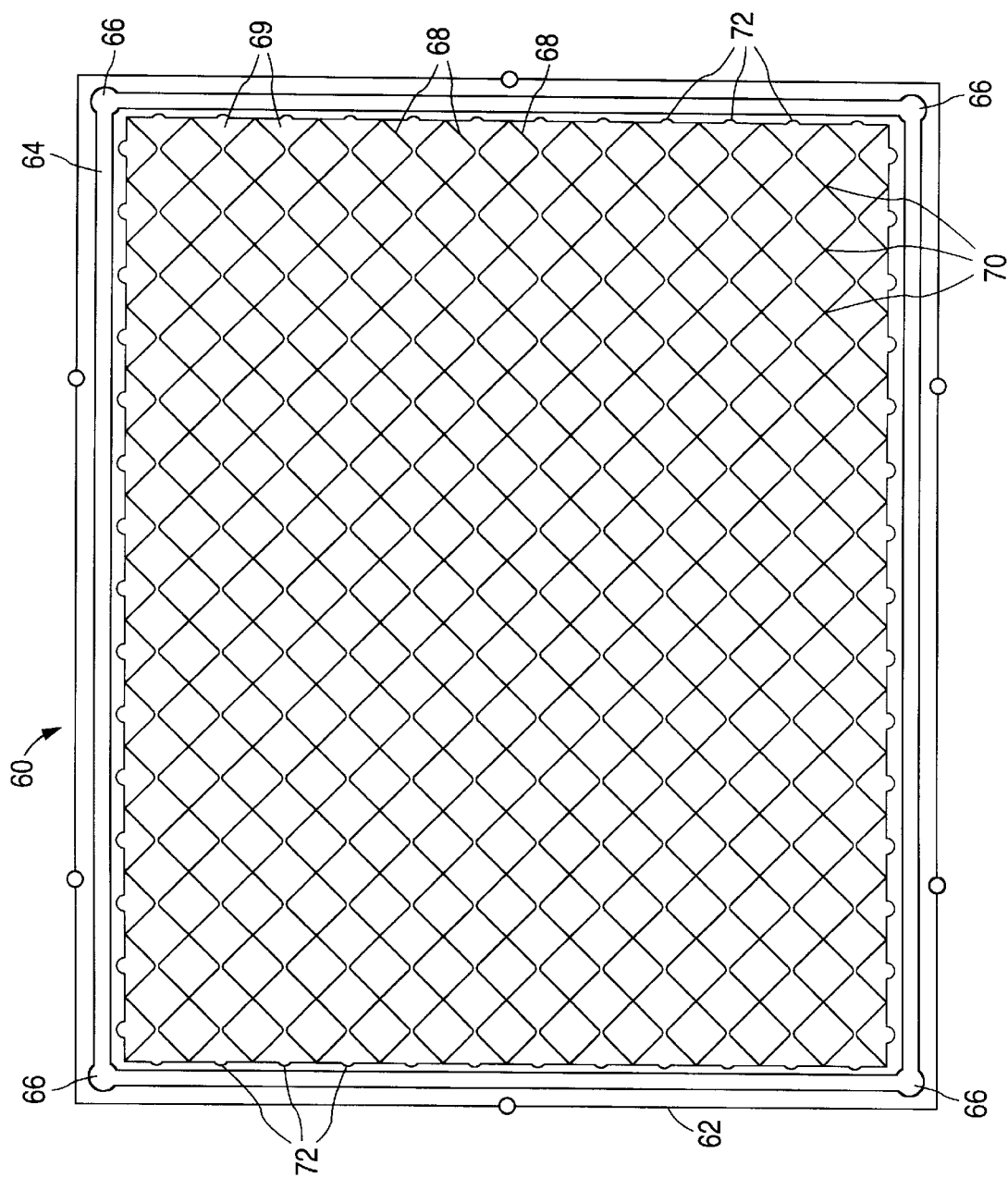
FIG. 4 shows the layout of the top conductive (horizontal) traces for a standard four-layer printed circuit board.

FIG. 4 shows an actual layout 60 of the top conductive traces for a standard four-layer touchpad as shown in FIGS. 1A–1D, which are on the finger-side of the printed circuit board 62. There is a rectangular ring 64 around the perimeter of the board 62, which is connected to the ground plane (not shown) through vias 66 at each corner. A via is a conductive through-hole that allows a connection to pass from one side to the other of board 62. The ground ring is not an operational part of the sensing electronics, and is not directly related to the present invention.

The bulk of the surface area is covered with an array of diamond-shaped conductors 68. Half of these diamonds 68 are connected together horizontally by twelve wires (traces) 69 that run the width of the pad. The interconnection between the diamonds occurs where they would have nearly touched at the corners 70, and is not readily apparent without close inspection. These horizontal wires terminate in vias 72 at the left and right edges of the board 62 shown by the semicircular lumps on the half-diamonds at the edges of board 62. Vias 72 connect to traces on the opposite side of the circuit board 62 then to the controller chip 48 as shown in FIG. 3. This leaves the other half of the diamonds 68 "floating", i.e., without electrical connections to any other device.

The "floating diamonds" 68 are not an essential part of the sensing scheme, but they do serve two purposes. First, the floating diamonds on the top (exposed) layer tend to increase capacitive coupling between the finger and the vertical sensor electrodes, which lie immediately underneath. This effect is generally believed to be small. Second, the floating diamonds create an even surface texture. If these diamonds were removed, the interleaved presence or absence of conductive diamonds on the top surface of the circuit board would create a visible and tangible texture. The surface is protected by a thin adhesive label, but the texture showing through the label would be cosmetically objectionable. One could look at the top-layer trace pattern as 12 (rather oddly-shaped) horizontal electrodes which, incidentally, share the top surface with a plurality of floating metal diamonds.

Figure 5:
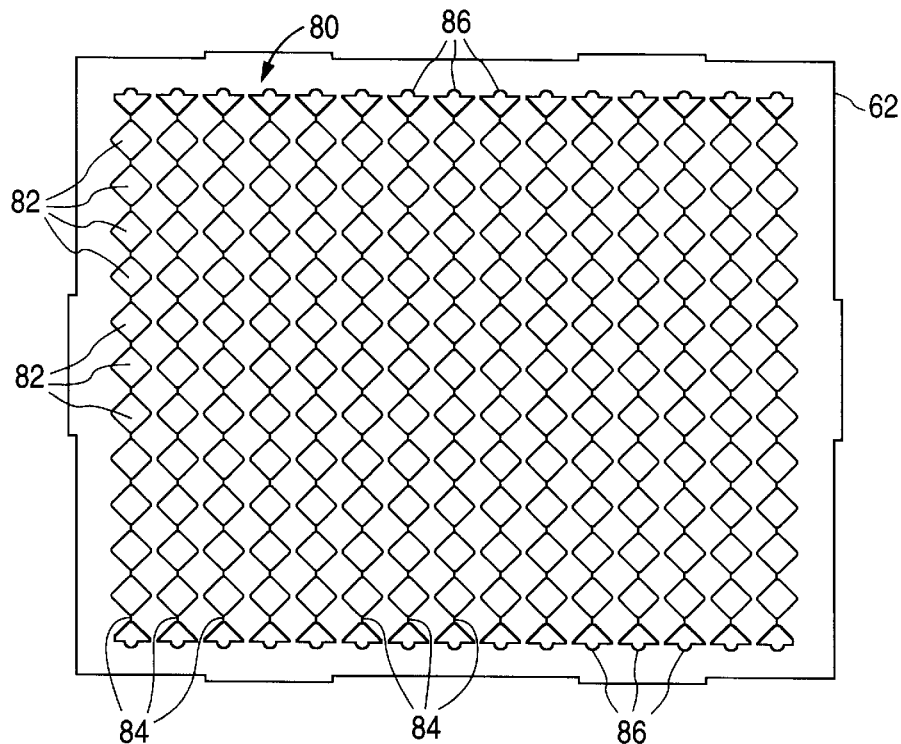
FIG. 5 shows the layout of the second layer with vertical conductive traces.

FIG. 5 shows the actual layout 80 of the second (hidden) layer conductive traces on printed circuit board 62. In a standard four-layer Synaptics touchpad, this layer is separated from the surface layer 60, shown in FIG. 4, by a thin 3-mil core layer of standard FR4 PC board laminate. Conductors deposited on this layer are close enough to the surface of the touchpad 10 to be subject to significant capacitive coupling from objects on the surface like, for example, a finger.

Lay-out 50 is half-covered with an array of diamond-shaped conductors 82. Diamonds 82 are connected together vertically by 15 wires or traces 84 that run the height of the layout 80. These vertical wires 84 terminate in vias at the top and bottom edges of the board, shown by the semicircular lumps 86 on the half-diamonds at the edges. These vias 86 connect to signal traces on the bottom (component) layer of the circuit board, and ultimately to the controller chip 48. The diamond-shaped conductors shown in FIG. 4 lie directly under the floating diamonds on the top layer, described above. The second-layer trace pattern define 15 (rather oddly-shaped) vertical electrodes.

In accordance with the present invention the second (hidden) layer is eliminated and the horizontal and vertical traces are consolidated in one layer. More particularly, the top trace layout 60, shown in FIG. 4, serves to locate both the horizontal and the vertical sensor electrodes by connecting the "floating" diamonds 68 together vertically. This cannot be accomplished by merely connecting them together with ordinary metal circuit board traces since those traces would be "blocked" by the traces 69 running horizontally. To overcome this problem another means for interconnection is utilized, namely, the use of screen-printed conductive ink to provided the vertical traces.

Screen-printed carbon ink is a standard, inexpensive process step used in high-volume circuit board manufacturing. Carbon ink is the most commonly-used variety of conductive ink, though any alternate type of conductive ink or paste such as silver ink would serve equally well for the purposes herein disclosed. Conductive inks compatible with printed circuit board screening processes can be obtained from a variety of vendors, including the Electra Polymers and Chemicals, America Corp. of Orange, Calif. An example actually used goes by the product name of Electrador ED-5500 series carbon conductor paste. While in the preferred embodiment, the conductive ink is screen printed, other methods of applying the conductive ink may be used.

The metal conductive traces on a circuit board are generally covered by a protective insulating layer known as solder mask. This protective layer keeps the metal from oxidizing and corroding over time. Often, it is desirable to have exposed conductive regions on the circuit board. These exposed conductive regions might be used, for example, as switch contacts, or for interconnection to other devices. There are several well-known techniques used to keep exposed metal from corroding. A subsequent gold-plating step, for example, affords substantial resistance to corrosion, but is comparatively expensive. A lower-cost alternative to gold-plating is screen-printed carbon ink.

Typically, exposed metal traces are "painted" with a selectively-applied (screen-printed) layer of ink loaded with graphite. The ink is somewhat conductive, so affords electrical connection. The ink is non-metallic, so it resists oxidation and corrosion. For example, carbon-ink printing is commonly used to form inexpensive arrays of switch contacts on printed circuit boards used in TV remote controls.

Carbon and other types of conductive inks are also widely used in the PC board industry to provide a supplemental layer of interconnection, thus eliminating the need for jumpers and other supplemental interconnect devices. This is the same purpose for which the conductive ink is used in the present invention.

Figure 6:
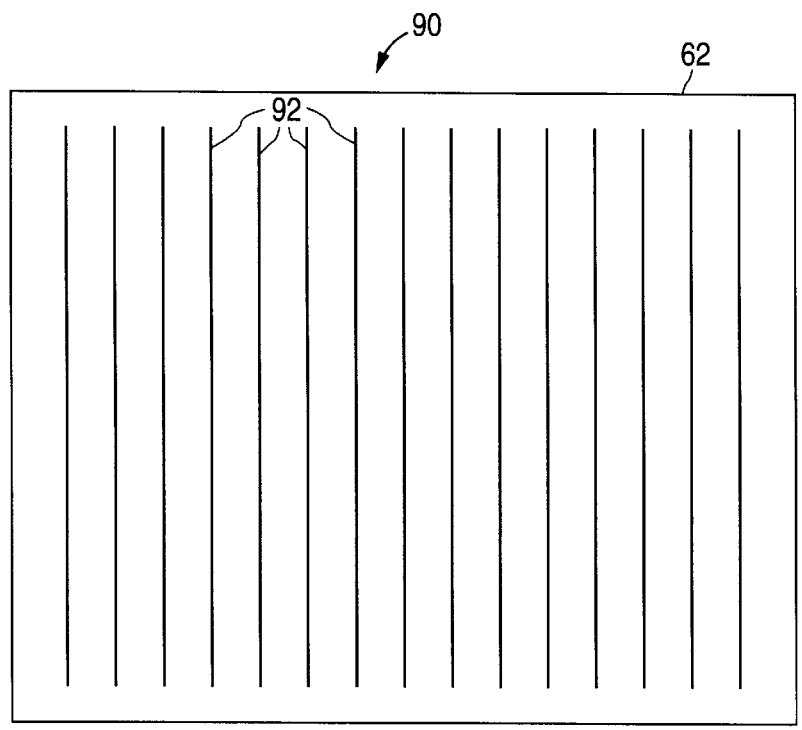
FIG. 6 shows the vertical carbon ink traces which are applied to the horizontal trace layout, in accordance with the present invention.

The present invention uses a screen-printed carbon ink step to connect vertically the "floating diamonds" 68 on the top layer. The carbon ink is applied in the form of 15 vertical "wires" which make contact with the exposed floating diamonds. A pattern 90, formed of a plurality of carbon ink lines 92, is shown in FIG. 6. Since the carbon ink is a conductor, the floating diamonds will now be connected together to form 15, rather oddly shaped vertical electrodes on layout 60 (FIG. 4). Thus, the single upper layer exactly duplicates the function of the 15 vertical electrodes on the second, hidden layer 80 (FIG. 5).

Figure 7:
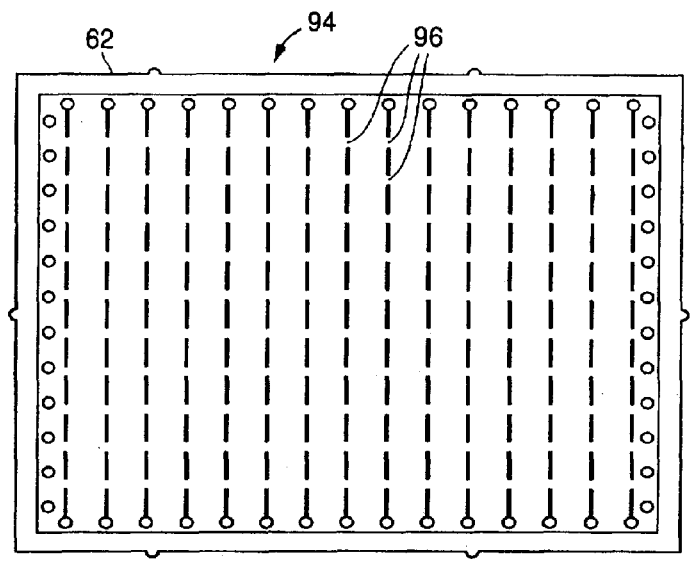
FIG. 7 shows the pattern for providing isolation between the horizontal traces and the vertical carbon ink traces, in accordance with the invention.

The conductive carbon ink must cross the horizontal wires or traces 69 on the top layer 60 without forming an electrical connection. This is accomplished by selective patterning of the insulating solder-mask layer covering the top surface. Solder-mask is a standard part of the printed circuit board process, and can be patterned without adding any additional cost. FIG. 7 shows a suitable pattern for the solder mask. Breaks in the solder mask under the vertical carbon ink lines allow the exposure of the "floating diamonds" 68; solder mask serves to insulate the horizontal wires or traces 69 underneath the vertically-running carbon ink traces shown in FIG. 6.

This arrangement removes the need for the layer 80 entirely, and therefore allows the sensor electrodes to be formed on a single PC board layer with the addition of a carbon-ink screening step, which is a comparatively inexpensive step. With the horizontal and vertical sensor electrodes all on one layer, the touchpad can now be constructed on a 2-layer printed circuit board, with the reverse or under side used for components and routing.

FIG. 8A is a plan view and FIG. 8B a cross-sectional view showing details of a composite, two-layer sensor touchpad 100 in accordance with the present invention. Printed circuit board 62 is covered with copper 101 to form conductive regions along the edge 102 of the printed circuit board 62, as well its sides and bottom, and to form the horizontal traces and diamonds 68. The vertical carbon ink traces or wires 104 are shown overlaying the floating diamonds 68 and horizontal conductors 69.

Solder mask insulation 103 is provided to separate the carbon ink traces from the horizontal copper traces 69 while allowing contact between the carbon ink traces and the diamonds 68, as shown in FIG. 8B. As is conventional, a mylar layer is provided over the top of the two-layer touchpad 100, but which is omitted from FIGS. 8A and 8B. Via 66, described above, is also shown in FIG. 8B.

FIG. 9 is a view of the actual underside 110 of a two-layer touchpad showing components attached thereto in the well known manner by soldering. Such components include the sensing circuitry, controller, interconnect wiring, or whatever conventional circuitry is associated with touchpad 10.

By suitable use of screen-printed carbon ink patterning, combined with patterning of the solder-mask layer on the top (finger) surface, a compact capacitive touchpad pointing device has been constructed using only a two-layer printed circuit board as a substrate with one layer on one side of the board defining both the horizontal and vertical traces and a second layer on the underside of the printed circuit board, formed in the conventional manner, by the controller chip and/or related touchpad circuitry.

Although the present invention has been shown and described with respect to preferred embodiments, various changes and modifications are deemed to lie within the spirit and scope of the invention as claimed. The corresponding structures, materials, acts, and equivalents of all means or step plus function elements in the claims which follow are intended to include any structure, material, or acts for performing the functions in combination with other claimed elements as specifically claimed.

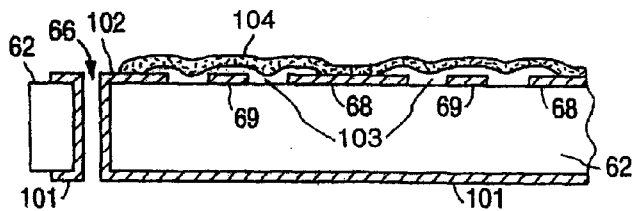

What is claimed is:

1. A touchpad pointing device comprising:
   a printed circuit board having a top and under side,
   a first layer on the top side of the printed circuit board which includes a plurality of metal sense pads,
   and a first plurality of conductive traces disposed in a first direction connecting some of said sense pads forming sensor electrodes in said first direction,
   and a second plurality of conductive traces disposed in a substantially orthogonal direction connecting others of said sense pads forming sensor electrodes in said second direction said first and second plurality of conductive traces are on the same surface of the first layer,
   and a second layer formed on the underside of the printed circuit board which includes conductors for the interconnection of electrical components associated with the touchpad.

2. The sensor of claim 1 wherein said first plurality of conductive traces is metal and where said second plurality of conductive traces is conductive ink.

3. A touchpad as in claim 2 where an insulator is provided at each intersection of a metal trace and conductive ink trace.

4. A touchpad as in claim 3 wherein said first plurality of metal traces is copper and wherein said plurality of conductive ink traces is carbon ink.

5. A touchpad as in claim 3 wherein the insulator is solder mask insulator.

6. A touchpad as in claim 3 where the sense pads are in the shape of diamonds.

7. A touchpad as in claim 3 including an additional protective layer of Mylar over the first layer.

8. A touchpad as in claim 2 wherein said first plurality of metal traces is formed in copper and wherein said second plurality of conductive ink traces is carbon ink.

9. A touchpad as in claim 2 where the sense pads are in the shape of diamonds.

10. A touchpad as in claim 2 including an additional protective layer of Mylar over the first layer.

11. A method of fabricating two-layer touchpad for use in a system for moving a cursor on a display screen comprising,
    forming a first layer on the top side of the printed circuit board which includes a plurality of metal sense pads,
    and a first plurality of conductive traces disposed in a first direction connecting some of said sense pads forming sensory electrodes in said first direction,
    and a second plurality of conductive traces disposed in a substantially orthogonal direction connecting others of said sense pads forming sensor electrodes in said second direction; said first and second plurality of conductive traces are on the same surface of the first layer,
    and forming a second layer formed on the underside of the printed circuit board which includes conductors for the interconnection of electrical components associated with the touchpad.

12. A method as in claim 11 wherein the step of forming said first plurality of conductive traces in metal is accomplished using conventional printed circuit board fabrication techniques and wherein the step of forming said second plurality of conductive traces is done as conductive ink traces.

13. A method as in claim 12 including the step of forming an insulator at each intersection of a metal trace and conductive ink trace.

14. A method as in claim 13 wherein the step of forming the first plurality of metal traces comprises forming them of copper and the step of forming said second plurality of conductive ink traces comprises forming them of carbon ink.

15. A method as in claim 13 wherein the step of forming an insulator comprises the step of forming a solder mask insulator.

16. A method as in claim 13 wherein the step of forming the sense pads comprises the step of forming them in the shape of diamonds.

17. A method as in claim 13 including the additional step of forming a protective layer of Mylar over the first layer.

18. A method as in claim 12 wherein the step of forming the first plurality of metal traces comprises forming them of copper and the step of forming said second plurality of conductive ink traces comprises forming them of carbon ink.

19. A method as in claim 12 wherein the step of forming the sense pads comprises the step of forming them in the shape of diamonds.

20. A method as in claim 12 including the additional step of forming a protective layer of Mylar over the first layer.

21. A touchpad pointing device comprising,
    a two-layer printed circuit board as a substrate,
    a first layer, located on the top side of the printed circuit board, which combines both horizontal and vertical sensor traces on the same surface of the first layer,
    and a second layer, located on the underside of the printed circuit board, which is formed by touchpad electronic circuitry.

22. A touchpad as in claim 21 wherein the horizontal traces are metal and the vertical traces are conductive ink.

* * * * *

UNITED STATES PATENT AND TRADEMARK OFFICE
CERTIFICATE OF CORRECTION

PATENT NO. : 6,188,391 B1
DATED : February 13, 2001
INVENTOR(S) : Seely et al.

It is certified that error appears in the above-identified patent and that said Letters Patent is hereby corrected as shown below:

The title page showing the illustrative figure should be deleted to be replaced with the attached title page.

Drawing sheet 4, consisting of Fig. 4, should be deleted to be replaced with the drawing sheet, consisting of Fig. 4, as shown on the attached page.

Drawing sheet 7, consisting of Fig. 7, 8A and 8B should be deleted to be replaced with the drawing sheet, consisting of Figs 7, 8A and 8B as shown on the attached page.

Signed and Sealed this

Twenty-second Day of July, 2003

JAMES E. ROGAN
*Director of the United States Patent and Trademark Office*

(12) United States Patent
Seely et al.

(10) Patent No.: US 6,188,391 B1
(45) Date of Patent: Feb. 13, 2001

(54) TWO-LAYER CAPACITIVE TOUCHPAD AND METHOD OF MAKING SAME

(75) Inventors: Joel Seely, Milpitas; Robert Leonard Malak, San Jose; Timothy Peter Allen, Santa Cruz; Richard Robert Schediwy, Union City; William Andrew Cesarotti, San Francisco, all of CA (US)

(73) Assignee: Synaptics, Inc., San Jose, CA (US)

( * ) Notice: Under 35 U.S.C. 154(b), the term of this patent shall be extended for 0 days.

(21) Appl. No.: 09/112,097

(22) Filed: Jul. 9, 1998

(51) Int. Cl.[7] .................................................. G09G 5/00
(52) U.S. Cl. ............................... 345/173; 178/18.03
(58) Field of Search ........................ 345/173, 174–179; 178/18.06, 18.01, 18.03; 341/22, 34, 33

(56) References Cited

U.S. PATENT DOCUMENTS

| | | |
|---|---|---|
| 5,305,017 | 4/1994 | Gerpheide . |
| 5,349,303 | 9/1994 | Gerpheide . |
| 5,543,590 | 8/1996 | Gillespie et al. . |
| 5,565,658 | 10/1996 | Gerpheide et al. . |
| 5,757,368 | 5/1998 | Gerpheide et al. . |
| 5,767,457 | 6/1998 | Gerpheide et al. . |
| 5,869,790 | * 2/1999 | Shigetaka et al. ............... 345/174 |
| 5,926,171 | * 7/1999 | Matsufusa et al. ............... 345/174 |

OTHER PUBLICATIONS

Website, http://www.safecomputing.com/alpspad.htm, "Cursor Controls—ALPS Numeric Pad & TrackPad", Aug. 6, 1998, p. 1.
Website, http://www.safecomputing.com/cirque__cats.htm, "Alternative Keyboards/Adapters—Cirque GlidePoint—Easycat, Powercat, Smartcat", Aug. 6, 1998, pp. 1–2.

* cited by examiner

*Primary Examiner*—Regina Liang
(74) *Attorney, Agent, or Firm*—Malcolm B. Wittenberg

(57) ABSTRACT

By suitable use of screen-printed carbon ink patterning, combined with patterning of the solder-mask layer on the top (finger) surface, a compact capacitive touchpad pointing device has been realized using only a two-layer board as a substrate. The first layer, on the topside of the printed circuit board, combines both the horizontal and vertical sensor electrode traces. The second layer, located on the underside of the printed circuit board, is formed in the conventional manner by attaching the controller chip and/or related circuitry.

22 Claims, 7 Drawing Sheets